(12) United States Patent
Kang et al.

(10) Patent No.: US 10,270,410 B2
(45) Date of Patent: Apr. 23, 2019

(54) APPARATUS AND METHOD FOR AUTOMATIC GAIN CONTROL

(71) Applicant: FCI Inc., Seongnam-si, Gyeonggi-do (KR)

(72) Inventors: Hyun Soo Kang, Seongnam-si (KR); BeomJin Kim, Seongnam-si (KR); Byeong Moo Moon, Seongnam-si (KR); JaeJun Ban, Seongnam-si (KR); MyungWoon Hwang, Seongnam-si (KR); ChulHee Kang, Seongnam-si (KR); Hyun Woo Park, Seongnam-si (KR)

(73) Assignee: FCI INC., Seongnam-si, Gyeonggi-Do (KR)

( * ) Notice: Subject to any disclaimer, the term of this patent is extended or adjusted under 35 U.S.C. 154(b) by 0 days.

(21) Appl. No.: 15/868,723

(22) Filed: Jan. 11, 2018

(65) Prior Publication Data

US 2018/0234066 A1   Aug. 16, 2018

(30) Foreign Application Priority Data

Feb. 15, 2017 (KR) .................. 10-2017-0020482

(51) Int. Cl.
*H03G 3/30* (2006.01)
*H04B 1/16* (2006.01)
*H03M 1/12* (2006.01)
*H03M 1/18* (2006.01)

(52) U.S. Cl.
CPC ......... *H03G 3/3036* (2013.01); *H03G 3/3068* (2013.01); *H03G 3/3078* (2013.01); *H03G 3/3089* (2013.01); *H03M 1/124* (2013.01); *H04B 1/16* (2013.01); *H03M 1/185* (2013.01)

(58) Field of Classification Search
CPC .. H03G 3/3036; H03G 3/3089; H03G 3/3078; H03G 3/3068; H03M 1/124; H03M 1/185; H04B 1/16
See application file for complete search history.

(56) References Cited

U.S. PATENT DOCUMENTS

| | | | | |
|---|---|---|---|---|
| 2005/0152317 A1* | 7/2005 | Awater | ................. | H04B 17/318 370/338 |
| 2006/0025090 A1* | 2/2006 | Shirakata | ............. | H04B 7/0808 455/136 |
| 2009/0268784 A1* | 10/2009 | Boehlke | ................. | H04B 1/713 375/133 |

* cited by examiner

*Primary Examiner* — Vineeta S Panwalkar
(74) *Attorney, Agent, or Firm* — Hauptman Ham, LLP (57) ABSTRACT

The present disclosure relates an automatic gain control apparatus and method for rapidly and effectively completing automatic gain control by performing a gain control procedure only three times irrespective of intensity of a received signal using peak values in an analog region and an output signal of an analog-digital converter.

15 Claims, 6 Drawing Sheets

APPARATUS AND METHOD FOR AUTOMATIC GAIN CONTROL

CROSS REFERENCE TO RELATED APPLICATIONS

This application claims the priority of Korean Application No. 10-2017-0020482 filed Feb. 15, 2017. The entire disclosure of the above application is incorporated herein by reference.

BACKGROUND

1. Technical Field

The present disclosure relates to an apparatus and method for automatic gain control.

2. Description of the Related Art

The information disclosed in this section is only for enhancement of understanding of the background of the invention and therefore it may contain information that does not form the prior art that is already known in this country to a person of ordinary skill in the art.

Methods of rapidly and accurately transmitting and receiving various types of data through a limited resource have been proposed.

When a wireless communication system is used, data is transmitted and received in the form of a packet for the above data transmission and reception. In particular, a data receiving apparatus detects a data packet transmitted through a limited resource and, then, restores the detected packet to extract data transmitted from a data transmitting apparatus. Here, in order to enhance a data transfer rate, a packet needs to be accurately detected.

In addition, in order to accurately receive signals with a wide dynamic range, which coexist in a wireless communication system, a variable gain amplifier (VGA) with adjustable gain is used.

Whenever signals with different sizes are received in order to maintain smooth communication, there is a need to set accurate gain of a VGA. However, intensities of received signals are irregular and are not predictable and, thus, a receiver needs to perform automatic gain control (AGC) to frequently change gain of the VGA.

When it is difficult to predict intensities of signals to be received and AGC needs to be rapidly completed, a method using an analog received signal strength indicator (RSSI) signal is mainly used. However, AGC apparatuses and methods using an RSSI signal have the following disadvantages.

Figure 1:
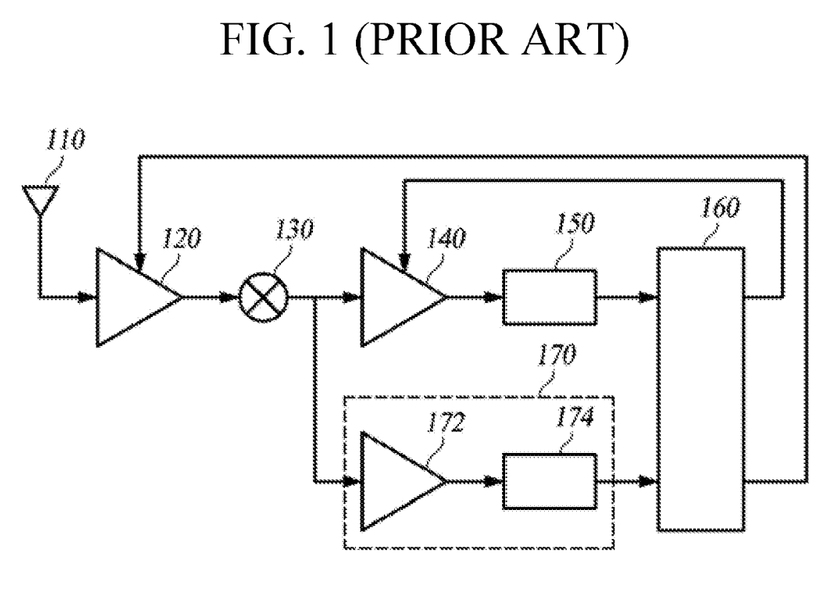
FIG. 1 is a diagram illustrating a concept of a general wireless receiver including an AGC apparatus using an RSSI signal.

FIG. 1 is a diagram illustrating a concept of a general wireless receiver including an AGC apparatus using an RSSI signal.

The general wireless receiver includes an antenna 110, a first amplifier 120, a mixer 130, a second amplifier 140, a first analog-to-digital converter (ADC) 150, a baseband signal processing unit 160, and a reception signal measurer 170. Here, the reception signal measurer 170 may include an RSSI signal generator 172 and a second ADC 174.

In order to apply the general AGC apparatus, an analog part such as the mixer 130 needs to output an RSSI signal and the RSSI signal needs to be digitized and, thus, an ADC 174 is further needed.

Figure 2:
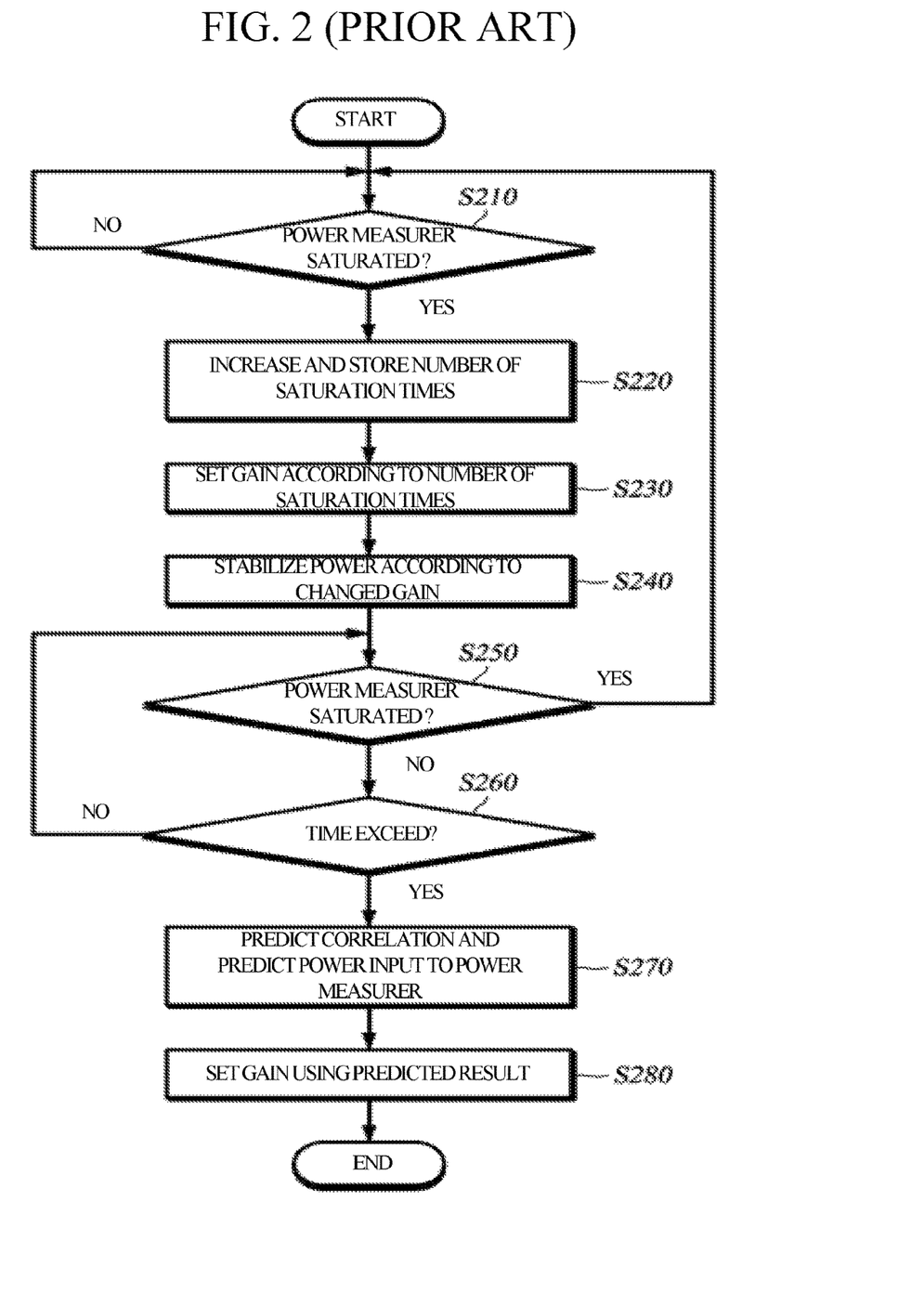
FIG. 2 is a flowchart of a general AGC method that does not use an RSSI signal.

FIG. 2 is a flowchart of a general AGC method that does not use an RSSI signal.

A receiver using the general AGC method that does not use an RSSI signal may be used only when a signal size is predictable. When intensity of a signal input to an ADC is greater than in a dynamic range of the ADC, an output signal from the ADC is distorted. That is, when input signal saturation of the ADC occurs, an output signal is distorted and intensity of a signal input to the ADC is not accurately recognized. Accordingly, an AGC apparatus is not capable of accurately controlling a gain value to be used for AGC setting.

Accordingly, the AGC apparatus needs to inevitably check whether input signal saturation occurs while continuously reducing a gain value of an amplifier ahead of an ADC.

When the AGC method is applied, as intensity of a signal input to an ADC is increased, time taken to complete AGC is further increased. In other words, a procedure of operations S210 to S250 needs to be repeatedly performed until input signal saturation of the ADC does not occur.

Figure 3:
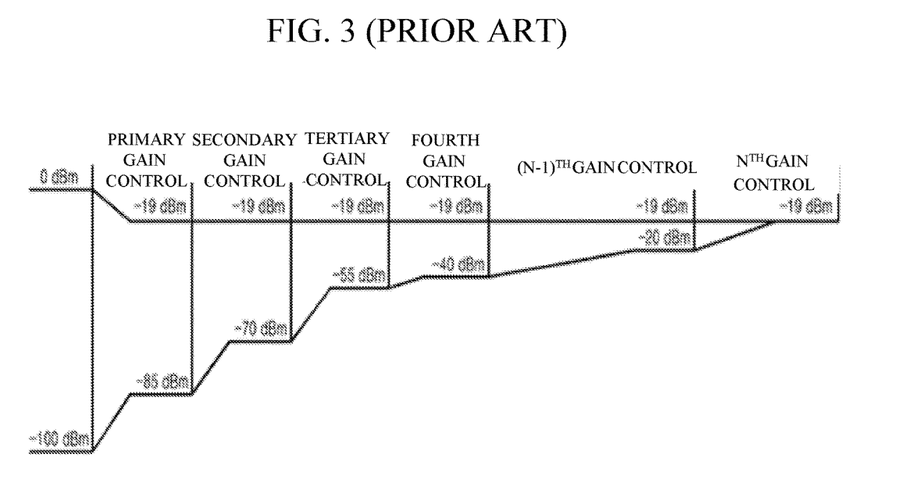
FIG. 3 is a diagram illustrating a concept of a procedure in which finally desired reception power is reached when a general AGC method that does not use an RSSI signal is used.

FIG. 3 is a diagram illustrating a concept of a procedure in which finally desired reception power is reached when a general AGC method that does not use an RSSI signal is used.

Intensity of a received signal is assumed to be −19 dBm. Intensity of a signal input to an ADC of a receiver is unknown and, thus, a range of a signal to be received is adjusted to an upper limit of −19 dBm from a lower limit of −85 dBm via a primary gain control procedure.

Although the primary gain control procedure is performed, a signal input to an ADC is still saturated and, thus, the lower limit of the signal to be received is re-adjusted to −70 dBm via a secondary gain control procedure.

Although the secondary gain control procedure is performed, the signal input to an ADC is still saturated and, thus, the lower limit of the signal to be received is re-adjusted to x55 dBm via a tertiary gain control procedure.

Lastly, intensity of the signal input to the ADC is measured without being saturated via an $N^{th}$ gain control procedure.

As such, as intensity of an input signal is increased, gain of an amplifier ahead of an ADC needs to be changed a plurality of times and, thus, time taken to complete gain control is increased.

Accordingly, there is a need for an AGC apparatus and method for completing gain control for a short time irrespective of intensity of a received signal.

SUMMARY

It is an object of the present disclosure to provide an automatic gain control (AGC) apparatus and method for reducing time taken to complete gain control irrespective of intensity of a received signal by combining a plurality of peak values.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, an automatic gain control apparatus includes a power measurer configured to measure intensity of a first signal output from an analog-to-digital converter (ADC) to output a first measurement value and to output a first logical signal according to intensity of the first signal, a packet detection unit configured to receive the first signal to detect a packet and to output a second logical signal according to a detection result, a peak detection determination unit configured to receive a peak value from a first amplifier, a mixer, and a second amplifier and to determine whether the peak value is valid, and a gain setting unit configured to receive the first signal, the first logical signal, a packet detection signal as output from the packet detection unit, and a peak detection determination signal as output from the peak detection determination unit and to set gain.

In accordance with one aspect of the present disclosure, an automatic gain control (AGC) method applied to a wireless receiver includes a first gain control procedure of detecting a first peak value while intensity of a first signal output from an analog-to-digital converter (ADC) is measured and a peak value is detected or measuring intensity of a second signal input to a mixer from a first amplifier of an analog block, a third signal input to a second amplifier from the mixer, and a fourth signal input to the analog-digital converter from the second amplifier to determine whether the second signal, the third signal and the fourth signal are valid and controlling at least one gain of the first amplifier and the second amplifier when a second peak value of the second signal, a third peak value of the third signal, and a fourth peak value of the fourth signal, output as a determination result, satisfy a preset condition, and a second gain control procedure of measuring a changed second signal input to the mixer from the first amplifier, a changed third signal input to the second amplifier from the mixer, and a changed fourth signal input to the analog-digital converter from the second amplifier, changed in the first gain control procedure, to check a changed second peak value of the changed second signal, a changed third peak value of the changed third signal, and a changed fourth peak value of the changed fourth signal, as a newly detected second peak value, third peak value, and fourth peak value, and correcting a first error during the first gain control procedure based on a changed first peak value of a changed first signal output from the analog-digital converter as intensity of the first signal changed in the first gain control procedure.

DETAILED DESCRIPTION

Reference will now be made in detail to the exemplary embodiments of the present disclosure with reference to the accompanying drawings. The same reference numbers will be used throughout this specification to refer to the same parts. In the following description of the present disclosure, a detailed description of known functions and configurations incorporated herein will be omitted when it may make the subject matter of the present disclosure unclear.

It will be understood that, although the terms first, second, A, B, (a), (b), etc. may be used herein to describe various elements of the present disclosure, these terms are only used to distinguish one element from another element and essential, order, or sequence of corresponding elements are not limited by these terms. The term "comprises", "includes", or "has" described herein should be interpreted not to exclude other elements but to further include such other elements since the corresponding elements may be included unless mentioned otherwise.

Hereinafter, an automatic gain control (AGC) apparatus and method according to an exemplary embodiment of the present disclosure will be described with reference to the accompanying drawings.

Figure 4:
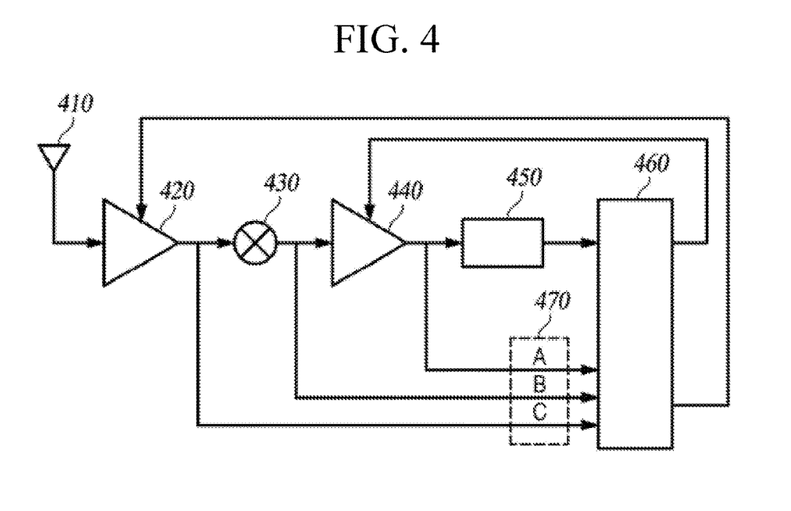
FIG. 4 is a diagram illustrating a concept of a wireless receiver including an AGC apparatus according to an exemplary embodiment of the present disclosure.

FIG. 4 is a diagram illustrating a concept of a wireless receiver including an AGC apparatus according to an exemplary embodiment of the present disclosure.

The AGC apparatus according to an exemplary embodiment of the present disclosure is formed in a wireless receiver including an antenna 410, a low noise amplifier (LNA) 420, a mixer 430, a programmable gain amplifier (PGA) 440, and an analog-to-digital converter (ADC) 450. Here, parts prior to conversion of an analog signal into a digital signal among parts for receiving a signal from the antenna 410 and transmitting and processing the signal to the LNA 420, the mixer 430, and so on may be referred to as an analog block. That is, the analog block includes the antenna 410, the LNA 420, the mixer 430, and the PGA 440. The ADC 450 and parts behind the ADC 450 correspond to a digital block.

A signal received by the antenna 410 is input to the LNA 420 and the LNA 420 amplifies a received weak signal. The LNA 420 may be designed to minimize noise of the amplified signal.

The mixer 430 converts a frequency of the signal amplified through the LNA 420. For example, the mixer 430 of the receiver including the AGC apparatus according to an exemplary embodiment of the present disclosure may down-convert a several GHz band of signal received through the antenna 410 into a signal with a frequency of several tens to several hundreds of MHz.

The PGA 440 may amplify a signal received from the mixer 430 according to set variable gain.

The ADC 450 may convert a signal of an analog region input from the PGA 440 into a signal of a digital region.

An AGC apparatus 460 may set a gain value of the LNA 420 and the PGA 440 based on a plurality of received peak values 470.

The plurality of peak values 470 includes a PGA peak value A, a mixer peak value B, and a LNA peak value C. The plurality of peak values 470 may provide information for inferring intensity of a signal received from the antenna 410.

Figure 5:
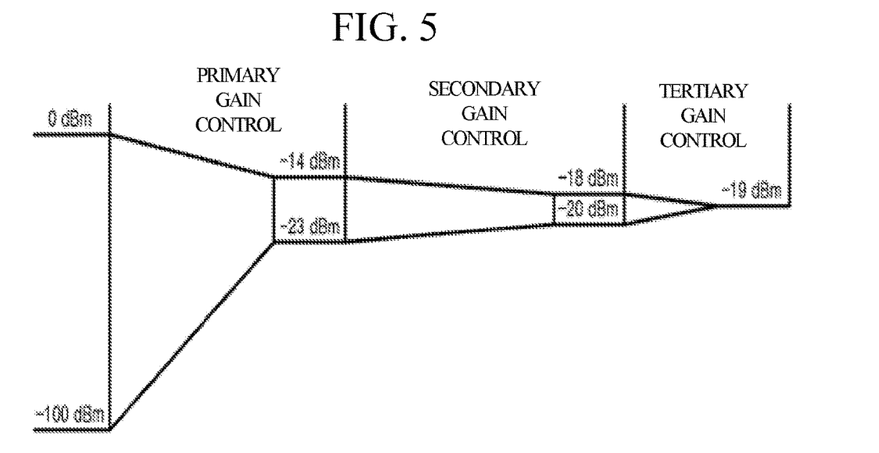
FIG. 5 is a diagram illustrating a concept of a procedure in which finally desired reception power is reached when an AGC apparatus or method according to an exemplary embodiment of the present disclosure is used.

FIG. 5 is a diagram illustrating a concept of a procedure in which finally desired reception power is reached when an AGC apparatus or method according to an exemplary embodiment of the present disclosure is used.

When the AGC apparatus according to an exemplary embodiment of the present disclosure is used, a gain control procedure is performed a maximum of three times and, thus, AGC is advantageously and significantly rapidly completed.

Intensity of a received signal is assumed to be −19 dBm. In a primary gain control procedure, a period in which intensity of the received signal is expected may be rapidly narrowed to a range of −23 dBm and −14 dBm using a plurality of peak values.

In the secondary gain control procedure, intensity of the signal predicted in the primary gain control procedure and intensity of an actual signal may be compared to narrow an error period. The period in which the intensity of the received signal in this procedure is predicted may be narrowed to a period between −20 dBm and −18 dBm. An automatic control procedure that is started due to other reasons other than a packet received during this procedure, e.g., neighboring channel interference may be canceled.

In the tertiary gain control procedure, gain values of the LNA 420 and the PGA 440 may be adjusted such that intensity of a signal input to the ADC 450 is a desired value.

Figure 6:
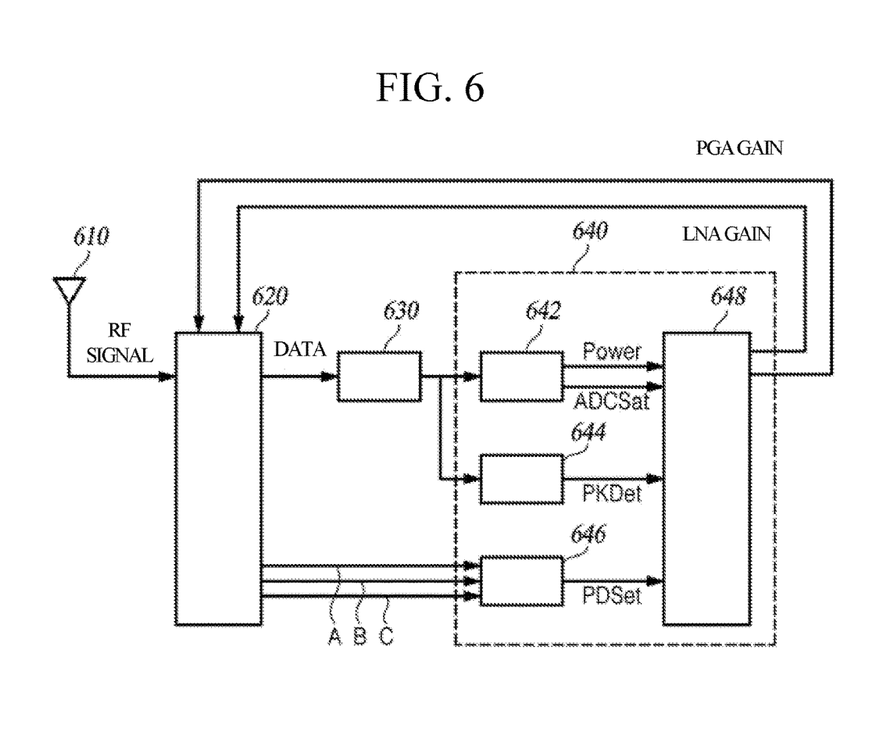
FIG. 6 is a diagram illustrating a concept of an AGC apparatus according to an exemplary embodiment of the present disclosure.

FIG. 6 is a diagram illustrating a concept of an AGC apparatus according to an exemplary embodiment of the present disclosure.

According to an exemplary embodiment of the present disclosure, an AGC apparatus 640 may be connected to an RF module unit 620 and an ADC 630 of a wireless receiver, may receive an output signal from each of the RF module unit 620 and the ADC 630, and may set gain values of a plurality of amplifies included in the RF module unit 620. Here, the output signal from the RF module unit 620 may be an analog signal and the output signal from the ADC 630 may be a digital signal.

An antenna 610 of the wireless receiver may receive an RF signal from the outside and transmit the RF signal to the RF module unit 620. The RF module unit 620 may amplify the received signal. The RF module unit 620 may perform frequency conversion on the amplified signal. The frequency-converted signal may be re-amplified. The ADC 630 may digitize a signal received from the RF module unit 620. The ADC 630 may transmit the converted digital signal to the AGC apparatus 640.

According to an exemplary embodiment of the present disclosure, the AGC apparatus 640 may include a power measurer 642, a packet detection unit 644, a peak detection determination unit 646, and a gain setting unit 648.

The power measurer 642 may measure intensity of an output signal from the ADC 630 in order to predict intensity of a signal input to the ADC 630. The power measurer 642 may transmit information about the measured power, i.e., intensity of a signal input to the ADC 630 and whether an input signal of the ADC 630 is saturated, to the gain setting unit 648. When intensity of the signal input to the ADC 630 is a value for saturating the ADC 630, the power measurer 642 may output a logical HIGH signal and, when the intensity is not the value for suturing the ADC 630, the power measurer 642 may output a logical LOW signal.

The packet detection unit 644 may receive the signal input to the ADC 630 and detect whether the signal include desired packet information. Whether the desired packet information is contained may be determined by performing correlation calculation. When the signal input to the ADC 630 contains the desired packet information, the packet detection unit 644 generates a packet detection signal. When the signal input to the ADC 630 includes undesired information, the packet detection unit 644 may generate a packet non-detection signal indicating that the signal input to the ADC 630 is not a normal signal. According to an exemplary embodiment of the present disclosure, when reception of a desired packet is checked, the packet detection unit 644 included in the AGC apparatus 640 outputs a logical HIGH signal and, when reception of the packet is not checked, the packet detection unit 644 outputs a logical LOW signal.

The peak detection determination unit 646 may receive a plurality of peak values from the RF module unit 620 and determine whether the RF module unit 620 is saturated. The plurality of peak values may include a first peak value A, a second peak value B, and a third peak value C. These peak values may include information for predicting a value such as an average reception power value, similarly to an RSSI signal.

The first peak value A, the second peak value B, and the third peak value C will be described with reference to FIG. 4. With reference to FIG. 4 and FIG. 6, the first peak value A may include information about an output signal from the LNA 420 included in the RF module unit 620. The second peak value B may include information about the output signal from the mixer 430 included in the RF module unit 620. The third peak value C may include information about the output signal from the PGA 440 included in the RF module unit 620. Here, the information about the output signal may include intensity of an output signal, and so on. For example, each of the first peak value A, the second peak value B, and the third peak value C may provide information for determining whether each of the LNA 420, the mixer 430, and the PGA 440 is saturated. Intensities of signals for saturating the LNA 420, the mixer 430, and the PGA 440 are different and, thus, a part among the LNA 420, the mixer 430, and the PGA 440, output of which is saturated, may be determined to predict approximate intensity of a signal received by an antenna.

The peak detection determination unit 646 may monitor the continuity or occupation of each detection value in order to determine whether the first peak value A, the second peak value B, and the third peak value C are each a reliable value. Here, the first peak value A, the second peak value B, and the third peak value C may correspond to a second boundary value, a third boundary value, and a fourth boundary value, respectively. For example, the second boundary value, the third boundary value, and the fourth boundary value may be −20 dBm, −40 dBm, and −60 dBm, respectively, and may be values set by the AGC apparatus according to an exemplary embodiment of the present disclosure.

The gain setting unit 648 may set gain values of amplifiers included in the RF module unit 620 based on an output signal from the power measurer 642, an output signal from the packet detection unit 644, and an output signal from the peak detection determination unit 646.

The gain setting unit 648 may set a gain value of at least one selected from the LNA 420 included in the RF module unit 620 and the PGA 440 included in the RF module unit 620 through an automatic gain control procedure of a first gain control procedure, a second gain control procedure, and a third gain control procedure.

When a first logical signal output from the power measurer 642 is a logical HIGH value, the gain setting unit 648 may change a gain value of at least one of the LNA 420 and the PGA 440 and make the first logical signal to a logical LOW value. A logical value of the first logical signal may be estimated based on intensity of a signal output from the ADC 630 and intensity of an in-band signal.

As a measurement result of the signal output from the ADC 630, when an input signal of the ADC 630 exceeds an input range of the ADC 630 and the ADC 630 is saturated, the ADC 630 may output a distorted digital signal. Accordingly, the gain setting unit 648 may change a gain value of at least one of the LNA 420 and the PGA 440 in order not to saturate the ADC 630. This procedure is the first gain control procedure.

Upon determining that the ADC 630 is not saturated, the gain setting unit 648 may perform the second gain control procedure. Through the second gain control procedure, intensity of the signal input to the ADC 630 is further close to a desired value. Through the first gain control procedure, a gain value of at least one of the LNA 420 and the PGA 440 may be changed and, according to the changed gain value of the LNA 420 and the PGA 440, intensity of a signal input to the ADC 630 may also be changed. The intensity of the signal input to the ADC 630 is changed and, thus, the power measurer 642 may re-measure intensity of a signal output from the ADC 630 once in order to predict the intensity of the signal input to the ADC 630.

Even if the second gain control procedure is performed, when it is determined that the intensity of the signal input to the ADC 630 does not reach a desired value, a third gain control procedure may be performed.

The gain setting unit 648 may re-set a gain value of the PGA 440 using the measurement value and the intensity of an in-band signal, which are received from the power measurer 642. Here, the measurement value received from the power measurer 642 refers to a value obtained by measuring a signal output from the ADC 630. The third gain control procedure may be performed by re-setting only a gain value of the PGA 440 because intensity of a signal to be processed is low.

Figure 7:
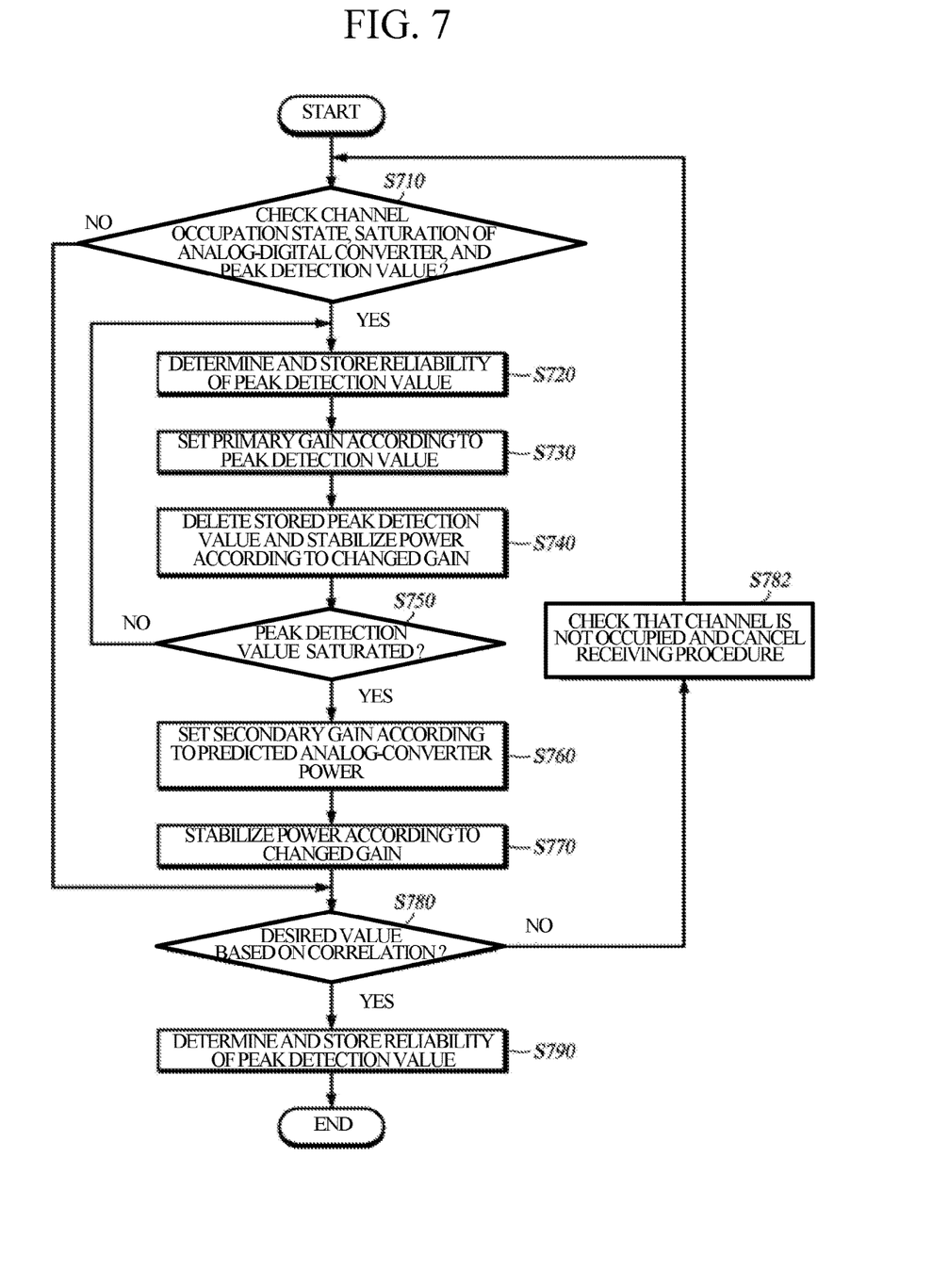
FIG. 7 is a flowchart of an automatic gain control method according to an exemplary embodiment of the present disclosure.

FIG. 7 is a flowchart of an automatic gain control method according to an exemplary embodiment of the present disclosure.

The automatic gain control method according to an exemplary embodiment of the present disclosure may be performed through the following procedures. For convenience of description, the method will be described with reference to FIG. 4 and FIG. 6.

The AGC apparatus 640 according to an exemplary embodiment of the present disclosure may check an occupation status of a channel using a power value that is intensity of the signal measured by the power measurer 642. As the check value of the occupation status of the channel, when it is determined that the channel is occupied by a desired packet, a receiving operation may be performed.

Here, the receiving operation refers to a series of operations for automatic gain control that is simultaneously performed with an operation of receiving a significant signal. The power measurer 642 measures a first measurement value as intensity of a signal output from the ADC 630 and intensity of an in-band signal and checks whether the first measurement value saturates the ADC 630 in order to predict intensity of a signal input to the ADC 630 (S710). As the check result, when the first measurement value is a value that does not saturate the ADC 630, whether the value is a desired value based on correlation may be determined (S780).

The peak detection determination unit 646 may receive a plurality of peak values from the RF module unit 620. The peak detection determination unit 646 may determine reliability of these values and store these values in order to set gains of the LNA 420 and the PGA 440 (S720).

The gain setting unit 648 may perform a first gain control procedure for setting gain values of the LNA 420 and the PGA 440 based on the first measurement value received from the power measurer 642 and a plurality of peak values received from the peak detection determination unit 646 (S730). Here, the plurality of peak values indicate whether a signal input to each of the LNA 420, the mixer 430, and the PGA 440 is saturated.

A plurality of peak values that are pre-stored prior to resetting of a gain value is deleted. As the gain values of the LNA 420 and the PGA 440 are reset, intensity of a signal input to the ADC 630 may temporally roll. The AGC apparatus 640 may wait for a predetermined time until intensity of the signal input to the ADC 630 is stabilized (S740).

The peak detection determination unit 646 may check whether the LNA 420, the mixer 430, and the PGA 440 included in the RF module unit 620 are saturated by an input signal (S750). As the check result, when even one of the LNA 420, the mixer 430, and the PGA 440 is not saturated, a second gain control procedure for reducing errors in the first gain control procedure may be performed (S760). Here, resetting of the gain value may be performed on the LNA 420 and the PGA 440.

Since the gain value is reset, the AGC apparatus 640 may wait for a predetermined time until intensity of the signal input to the ADC 630 is stabilized (S770). The power measurer 642 may recalculate intensity of a signal input to the power measurer 642. Here, in order to determine whether change in the signal input to the power measurer 642 is caused by external reasons such as neighboring channel interference, correlation calculation may be further performed (S780).

As the result of the correlation calculation, when a desired value is measured based on the correlation, a third gain control procedure for controlling gain of the PGA 440 may be further performed (S790).

When some or all selected from the first gain control procedure, the second gain control procedure, and the third gain control procedure are started due to other reasons other than a packet received during this procedure, e.g., neighboring channel interference, a processing procedure may be further performed so as to cancel each gain control procedure. As the result of the correlation calculation of operation S780, when a desired value is measured based on the correlation, an operation in which a channel is not checked to be occupied may be further performed (S782). A receiving procedure is canceled simultaneously with checking that the channel is not occupied and returns to an initial state.

Although FIG. 7 illustrates the case in which operations are sequentially performed, the present disclosure is not limited thereto. In other words, the operations of FIG. 7 may be changed and executed and one or more operations may be performed in parallel and, thus, FIG. 7 is not limited to a time sequence.

The operations illustrated in the flowchart of FIG. 7 may be embodied as a code readable by a computer in a computer-readable recording medium. Examples of the computer-readable recording medium include any type of recording device that stores data. That is, the computer-readable recording medium includes a magnetic storage medium (e.g., a read-only memory (ROM), a floppy disc, or a hard disc), optical reading medium (e.g., a compact disc (CD)-ROM or a digital versatile disc (DVD)), and carrier wave (e.g., transmission through the Internet). The computer-readable recording medium may be distributed over network coupled computer systems so that the computer-readable code may be stored and executed in a distributed fashion.

According to an exemplary embodiment of the present disclosure, a gain control procedure is performed only three times irrespective of intensity of a received signal and, thus, an AGC apparatus and method for completing automatic gain control within a short time period may be provided.

According to another exemplary embodiment of the present disclosure, even if errors occur in an operation of an AGC apparatus, a procedure in which the operation is performed is rapidly discovered and, thus, efficient automatic gain control may be provided.

While this invention has been particularly shown and described with reference to preferred embodiments thereof, it will be understood by those skilled in the art that various changes in form and details may be made therein without departing from the spirit and scope of the invention as defined by the appended claims. The preferred embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. An automatic gain control apparatus comprising:
   a power measurer configured to measure intensity of a first signal output from an analog-to-digital converter (ADC) to output a first measurement value and to output a first logical signal according to intensity of the first signal;
   a packet detection unit configured to receive the first signal to detect a packet and to output a second logical signal according to a detection result;
   a peak detection determination unit configured to receive a peak value from a first amplifier, a mixer, and a second amplifier and to determine whether the peak value is valid; and
   a gain setting unit configured to receive the first signal, the first logical signal, a packet detection signal as output from the packet detection unit, and a peak detection determination signal as output from the peak detection determination unit and to set gain.

2. The automatic gain control apparatus according to claim 1, wherein the power measurer estimates intensity of the first signal and intensity of a second signal as an in-band signal using the first signal.

3. The automatic gain control apparatus according to claim 1, wherein the power measurer determines whether the analog-digital converter is saturated based on the intensity of the first signal, outputs the first logical signal as a logical HIGH value when the intensity of the first signal is a value for saturating the analog-digital converter as a determination result of whether the analog-digital converter is saturated, and outputs the first logical signal as a logical LOW value when the intensity of the first signal is not the value for saturating the analog-digital converter.

4. The automatic gain control apparatus according to claim 1, wherein the packet detection unit determines whether a desired packet is received through correlation calculation, outputs the second logical signal as a logical HIGH value when a desired packet is received as a result of the correlation calculation, and outputs the second logical signal as a logical LOW value in other cases.

5. The automatic gain control apparatus according to claim 1, wherein the peak detection determination unit receives a third logical signal indicating a saturation state of a signal input to the mixer from the first amplifier, a fourth logical signal indicating a saturation state of a signal input to the second amplifier from the mixer, and a fifth logical signal indicating a saturation state of a signal input to the analog-digital converter from the second amplifier, compares the third logical signal, the fourth logical signal, and the fifth logical signal with a first reference value, a second reference value, and a third reference value, respectively, to determine whether the third logical signal, the fourth logical signal, and the fifth logical signal are available and valid, and outputs determination results to a second peak value, a third peak value, and a fourth peak value.

6. The automatic gain control apparatus according to claim 1, wherein the gain setting unit simultaneously determines the intensity of the first signal, the first logical signal, the packet detection signal, and the peak detection determination signal and sets at least one gain of the first amplifier and the second amplifier.

7. The automatic gain control apparatus according to claim 6, wherein the gain setting unit sets at least one gain of the first amplifier and the second amplifier through an automatic gain control procedure of a first gain control procedure, a second gain control procedure, and a third gain control procedure.

8. The automatic gain control apparatus according to claim 7, wherein the gain setting unit changes at least one gain value of the first amplifier and the second amplifier when the first logical signal is a logical HIGH value.

9. The automatic gain control apparatus according to claim 8, wherein the gain setting unit checks the intensity of the first signal and changes at least one gain value of the first amplifier and the second amplifier when the first logical signal is a logical LOW value.

10. The automatic gain control apparatus according to claim 9, wherein the gain setting unit checks intensity of a newly generated first signal as at least one gain value of the first amplifier and the second amplifier and changes at least one value of the first amplifier and the second amplifier.

11. An automatic gain control (AGC) method applied to a wireless receiver, the method comprising:
   a first gain control procedure of detecting a first peak value while intensity of a first signal output from an analog-to-digital converter (ADC) is measured and a peak value is detected or measuring intensity of a second signal input to a mixer from a first amplifier of an analog block, a third signal input to a second amplifier from the mixer, and a fourth signal input to the analog-digital converter from the second amplifier to determine whether the second signal, the third signal and the fourth signal are valid and controlling at least one gain of the first amplifier and the second amplifier when a second peak value of the second signal, a third peak value of the third signal, and a fourth peak value of the fourth signal, output as a determination result, satisfy a preset condition; and
   a second gain control procedure of measuring a changed second signal input to the mixer from the first amplifier, a changed third signal input to the second amplifier from the mixer, and a changed fourth signal input to the analog-digital converter from the second amplifier, changed in the first gain control procedure, to check a changed second peak value of the changed second signal, a changed third peak value of the changed third signal, and a changed fourth peak value of the changed fourth signal, as a newly detected second peak value, third peak value, and fourth peak value, and correcting a first error during the first gain control procedure based on a changed first peak value of a changed first signal output from the analog-digital converter as intensity of the first signal changed in the first gain control procedure.

12. The method according to claim 11, further comprising a third gain control procedure of controlling gain of the second amplifier in order to reduce the first error when the first error is greater than the first error.

13. The method according to claim 12, further comprising a processing procedure of canceling the first gain control procedure or the second gain control procedure when the first gain control procedure or the second gain control procedure is not started by a value that is not desired based on correlation.

14. The method according to claim 13, wherein the third gain control procedure controls the second amplifier using intensity of the changed first peak value of the changed first signal output from the analog-digital converter and an in-band signal.

15. The method according to claim 11, further comprising an additional control procedure of checking the changed second peak value of the changed second signal, the changed third peak value of the changed third signal, and the changed fourth peak value of the changed fourth signal to determine whether the first gain control procedure is valid and to determine whether a corresponding receiving procedure is canceled.

* * * * *